(12) United States Patent
Fujita et al.

(10) Patent No.: US 10,529,488 B2
(45) Date of Patent: Jan. 7, 2020

(54) ELECTRONIC COMPONENT

(71) Applicant: Murata Manufacturing Co., Ltd., Nagaokakyo-shi, Kyoto-fu (JP)

(72) Inventors: Yukihiro Fujita, Nagaokakyo (JP); Takashi Fukuma, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 41 days.

(21) Appl. No.: 15/828,472

(22) Filed: Dec. 1, 2017

(65) Prior Publication Data

US 2018/0158608 A1  Jun. 7, 2018

(30) Foreign Application Priority Data

Dec. 2, 2016 (JP) ................ 2016-235075

(51) Int. Cl.
| | |
|---|---|
| H01G 4/30 | (2006.01) |
| H01G 2/06 | (2006.01) |
| H01G 4/232 | (2006.01) |
| H01G 4/005 | (2006.01) |
| H01G 4/12 | (2006.01) |
| H05K 1/11 | (2006.01) |
| H05K 1/18 | (2006.01) |
| H05K 1/02 | (2006.01) |

(52) U.S. Cl.
CPC ............... *H01G 4/30* (2013.01); *H01G 4/005* (2013.01); *H01G 4/12* (2013.01); *H01G 4/232* (2013.01); *H05K 1/0216* (2013.01); *H05K 1/113* (2013.01); *H05K 1/181* (2013.01); *H05K 2201/09481* (2013.01); *H05K 2201/10378* (2013.01)

(58) Field of Classification Search
CPC ................... H01G 4/30; H01G 4/228
See application file for complete search history.

(56) References Cited

U.S. PATENT DOCUMENTS

2012/0257322 A1\* 10/2012 Shiota .................... H01G 4/012
361/301.4
2014/0284089 A1  9/2014 Hattori et al.
(Continued)

FOREIGN PATENT DOCUMENTS

| CN | 104064355 A | 9/2014 |
|---|---|---|
| CN | 104835646 A | 8/2015 |

(Continued)

*Primary Examiner* — Eric W Thomas
(74) *Attorney, Agent, or Firm* — Keating & Bennett, LLP

(57) ABSTRACT

An electronic component includes a multilayer capacitor and an interposer including a substrate main body with an electric insulation property, the multilayer capacitor being mounted on one main surface side of the substrate main body. The multilayer capacitor includes a multilayer body, a first outer electrode, and a second outer electrode. The multilayer body includes an effective region and a non-effective region surrounding the effective region. A width of the effective region is larger than a width of the substrate main body, when a width of the multilayer body is represented by $W_{11}$, a thickness of the multilayer body is represented by $T_{11}$, and a thickness of the substrate main body is represented by $T_{21}$, a value of $W_{11}/(T_{11}+T_{21})$ is not less than about 0.90 and not more than about 1.10.

20 Claims, 7 Drawing Sheets

(56) References Cited

U.S. PATENT DOCUMENTS

| | | |
|---|---|---|
| 2015/0228409 A1 | 8/2015 | Fujita et al. |
| 2016/0007446 A1 | 1/2016 | Ishikawa et al. |
| 2016/0093439 A1 | 3/2016 | Fujita et al. |

FOREIGN PATENT DOCUMENTS

| | | | |
|---|---|---|---|
| CN | 105469984 A | | 4/2016 |
| JP | 07335473 A | * | 12/1995 |
| JP | 2014-179583 A | | 9/2014 |

* cited by examiner

ELECTRONIC COMPONENT

CROSS REFERENCE TO RELATED APPLICATIONS

This application claims the benefit of priority to Japanese Patent Application No. 2016-235075 filed on Dec. 2, 2016. The entire contents of this application are hereby incorporated herein by reference.

BACKGROUND OF THE INVENTION

1. Field of the Invention

The present invention relates to an electronic component including a multilayer capacitor and an interposer.

2. Description of the Related Art

Recently, as electronic devices continue to provide higher levels of performance, capacitance of a multilayer ceramic capacitor has increased. In the multilayer ceramic capacitor with large capacitance, as a dielectric material, ceramic materials with a high-dielectric constant, for example, barium titanate or the like are included.

These ceramic materials with the high-dielectric constant include piezoelectricity and an electrostriction property, in the multilayer ceramic capacitor including the dielectric including the ceramic material with the high-dielectric constant, mechanical distortion occurs when a voltage is applied.

Accordingly, when an AC voltage or a DC voltage to which an AC component is superimposed is applied to a multilayer ceramic capacitor mounted in or on a circuit substrate, vibration due to distortion of the multilayer ceramic capacitor occurs in the multilayer ceramic capacitor, and therefore, by the vibration propagating in the circuit substrate, the circuit substrate vibrates.

Here, in a case where the circuit substrate vibrates at a frequency not lower than about 20 Hz and not higher than about 20,000 Hz which is an audible frequency range by the vibration propagating therein, a noise called an "acoustic noise" occurs.

Various types of techniques have been proposed as a technique to reduce the noise, for example, Japanese Unexamined Patent Application Publication No. 2014-179583 discloses a multilayer ceramic capacitor with an interposer which includes an interposer including an insulating substrate, two first conductor pads, two second conductor pads, and two conductor vias respectively connecting the first conductor pads and the second conductor pads, and a multilayer ceramic capacitor each outer electrode of which is bonded to each of the first conductor pads of the interposer with solder interposed therebetween. In the multilayer ceramic capacitor with the interposer disclosed in Japanese Unexamined Patent Application Publication No. 2014-179583, each of the conductor vias of the interposer includes a through-hole in the inside thereof, and a gap not filled with the solder is provided on the second conductor pad side of each of the through-holes.

However, there is still room for improvement in reducing the acoustic noise of the multilayer capacitor while maintaining a good balance with a capacitance of the multilayer capacitor.

SUMMARY OF THE INVENTION

Preferred embodiments of the present invention provide electronic components in which an acoustic noise of a multilayer capacitor is able to be significantly reduced or preventing while maintaining a good balance with a capacitance of the multilayer capacitor.

An electronic component according to a preferred embodiment of the present invention includes a multilayer capacitor, and an interposer including a substrate main body with an electric insulation property, the multilayer capacitor being mounted on one main surface side of the substrate main body, in which the multilayer capacitor includes a multilayer body in which a plurality of dielectric layers and a plurality of inner electrode layers are laminated, a first outer electrode, and a second outer electrode, the multilayer body includes a first main surface opposing in a thickness direction orthogonal or substantially orthogonal to the one main surface of the substrate main body, a second main surface opposing in the thickness direction orthogonal or substantially orthogonal to the one main surface of the substrate main body and opposing the one main surface of the substrate main body, a first end surface and a second end surface opposing each other in a length direction orthogonal or substantially orthogonal to the thickness direction, and a first side surface and a second side surface opposing each other in a width direction orthogonal or substantially orthogonal to the thickness direction and the length direction, the first outer electrode is located on the first end surface of the multilayer body and electrically connected to at least a first portion of the plurality of inner electrode layers, the second outer electrode is located on the second end surface of the multilayer body and electrically connected to at least a second portion of the plurality of inner electrode layers, the multilayer body includes an effective region in which the inner electrode layers each connected to the first outer electrode and the second outer electrode are laminated with the dielectric layer located therebetween and a non-effective region surrounding the effective region, a width $W_{11e}$ of the effective region is larger than a width $W_{21}$ of the substrate main body, when a width of the multilayer body is represented by $W_{11}$, a thickness of the multilayer body is represented by $T_{11}$, and a thickness of the substrate main body is represented by $T_{21}$, a value of $W_{11}/(T_{11}+T_{21})$ is not less than about 0.90 and not more than about 1.10.

In an electronic component according to a preferred embodiment of the present invention, the thickness $T_{21}$ of the substrate main body is preferably not more than about 80 μm.

In an electronic component according to a preferred embodiment of the present invention, when a thickness of the non-effective region on the second main surface side is represented by $T_a$, a value of $T_a/T_{21}$ is preferably not less than about 0.15 and not more than about 0.50.

In an electronic component according to a preferred embodiment of the present invention, both a width $W_a$ of the non-effective region on the first side surface side and a width $W_b$ of the non-effective region on the second side surface side are preferably not more than about 20 μm.

In an electronic component according to a preferred embodiment of the present invention, when the width of the non-effective region on the first side surface side is represented by $W_a$, the width of the non-effective region on the second side surface side is represented by $W_b$, both a value of $W_a/T_{21}$ and a value of $W_b/T_{21}$ are preferably not less than about 0.13 and not more than about 0.67.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
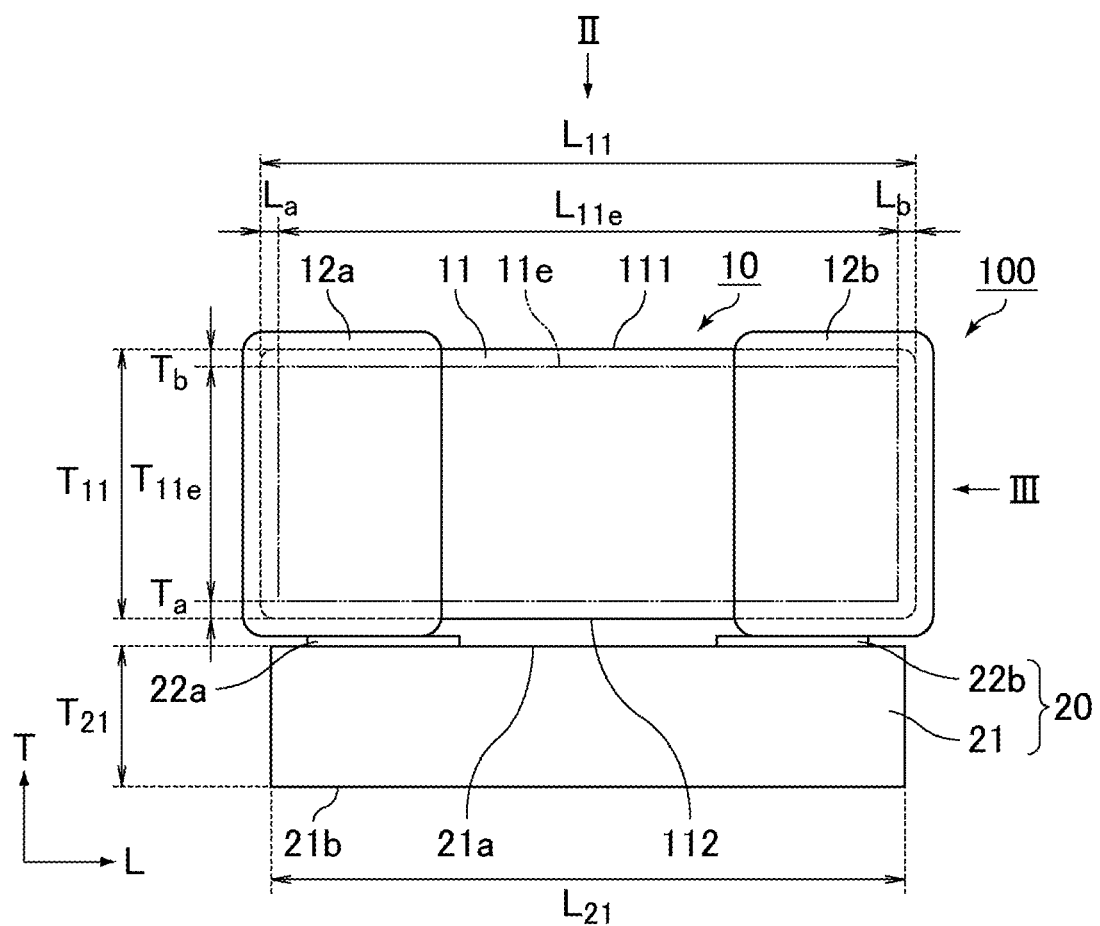
FIG. 1 is a front view schematically illustrating an electronic component according to a preferred embodiment of the present invention.

Hereinafter, preferred embodiments of the present invention will be described with reference to the drawings.

It is to be noted that the following preferred embodiments represent examples of the present invention for merely illustrative purposes, and that the present invention is not limited to matters disclosed in the following preferred embodiments. The matters disclosed in the different preferred embodiments are able to be combined with each other in practical applications, and modified preferred embodiments in those cases are also included in the scope of the present invention. The drawings serve to assist understanding of the preferred embodiments, and they are not always exactly drawn in a strict sense. In some cases, for instance, dimension ratios between elements themselves or dimension ratios of distances between elements or features, which are shown in the drawings, may not match with the dimension ratios described in this description. Furthermore, some of the elements or features, which are explained in this description, are omitted from the drawings, or they are shown in a reduced number on a case-by-case basis.

Although the preferred embodiments of the present invention describe a case where a multilayer capacitor is a multilayer ceramic capacitor, a dielectric material of the multilayer capacitor is not limited to a ceramic material as long as distortion is able to occur by voltage application. For example, the preferred embodiments of the present invention are able to also be applied to a multilayer type metallized film capacitor or the like which is a multilayer capacitor in which a resin material is included as the dielectric material excluding the ceramic material.

Figure 2:
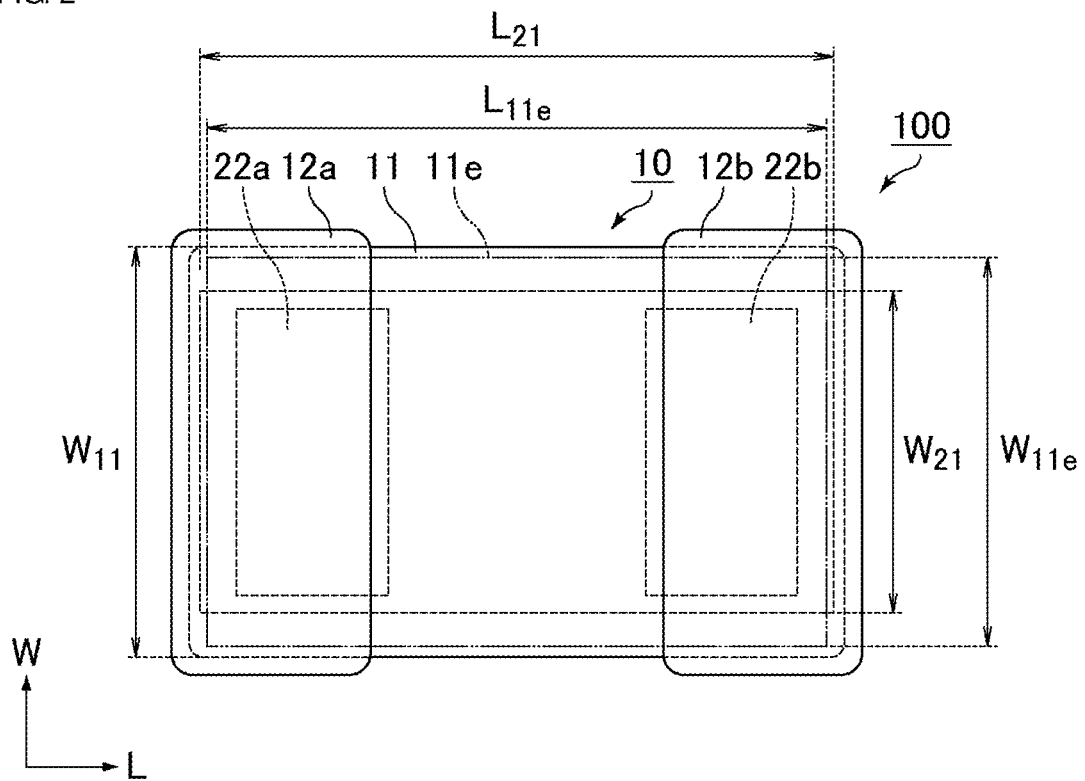
FIG. 2 is a plan view of the electronic component illustrated in FIG. 1, viewed from a direction of an arrow II.
Figure 3:
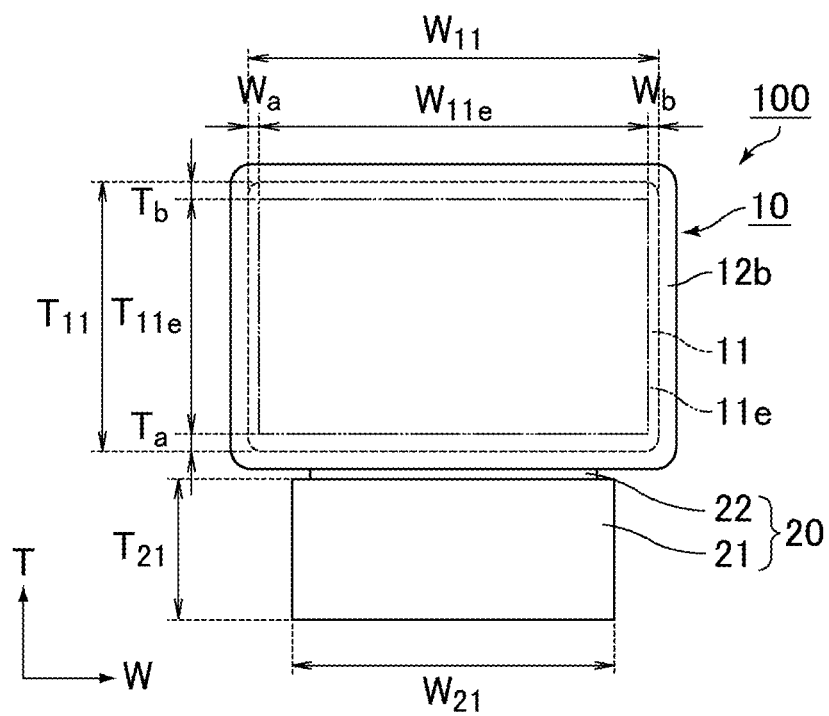
FIG. 3 is a side view of the electronic component illustrated in FIG. 1, viewed from a direction of an arrow III.

FIG. 1 is a front view schematically illustrating an electronic component according to a preferred embodiment of the present invention. FIG. 2 is a plan view of the electronic component illustrated in FIG. 1, viewed from a direction of an arrow II. FIG. 3 is a side view of the electronic component illustrated in FIG. 1, viewed from a direction of an arrow III.

An electronic component 100 illustrated in FIG. 1 to FIG. 3 includes a multilayer ceramic capacitor 10 and an interposer 20 on which the multilayer ceramic capacitor 10 is mounted on one main surface 21a side of a substrate main body 21.

FIG. 1 to FIG. 3 illustrate a length direction L, a width direction W, and a thickness direction T of the multilayer ceramic capacitor 10. Similar features are shown in FIG. 4 to FIG. 7 which will be described later. Here, the length direction L, the width direction W, and the thickness direction T are orthogonal or substantially orthogonal to one another. The thickness direction T is a direction orthogonal or substantially orthogonal to the one main surface 21a of the substrate main body 21.

Figure 4:
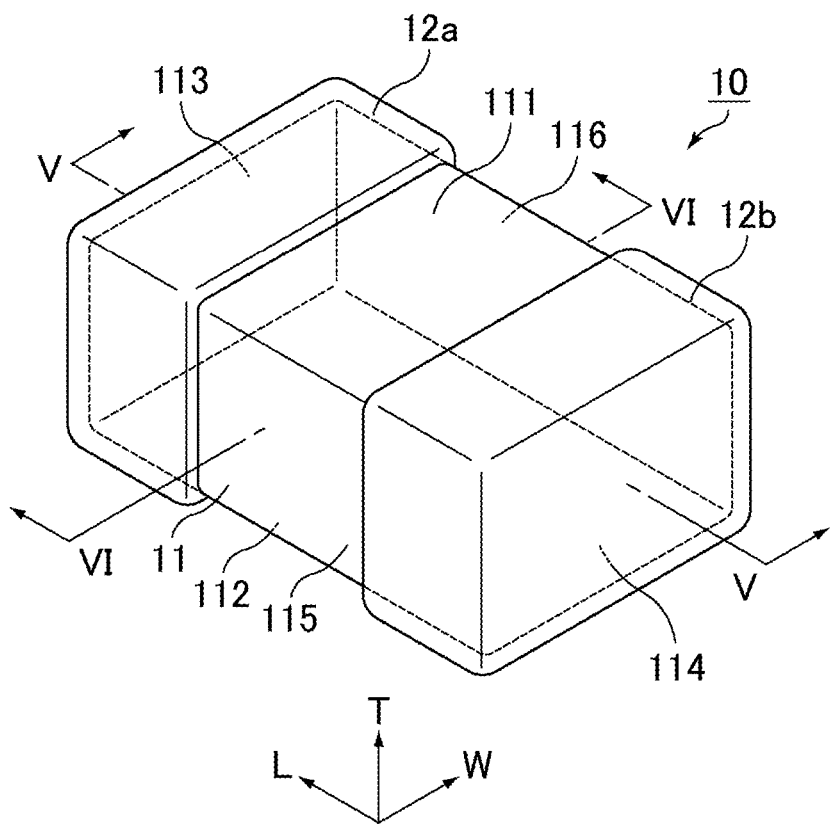
FIG. 4 is a perspective view schematically illustrating a multilayer ceramic capacitor of the electronic component illustrated in FIG. 1.

FIG. 4 is a perspective view schematically illustrating the multilayer ceramic capacitor of the electronic component illustrated in FIG. 1.

As illustrated in FIG. 4, the multilayer ceramic capacitor 10 includes a multilayer body 11, and a first outer electrode 12a and a second outer electrode 12b provided on the multilayer body 11 and located on surfaces of both end portions in the length direction L. In the present preferred embodiment, although the multilayer ceramic capacitor includes the two outer electrodes, the multilayer capacitor in the electronic component according to other preferred embodiments of the present invention may include more than two outer electrodes.

The multilayer body 11 includes a first main surface 111 opposing in the thickness direction T, a second main surface 112 opposing in the thickness direction T and opposing the one main surface 21a of the substrate main body 21, a first end surface 113 and a second end surface 114 opposing each other in the length direction L orthogonal or substantially orthogonal to the thickness direction T, and a first side surface 115 and a second side surface 116 opposing each other in the width direction W orthogonal or substantially orthogonal to the thickness direction T and the length direction L.

The multilayer body 11 includes a rectangular parallelepiped or a substantially rectangular parallelepiped outer shape, and at least one of a corner portion and a ridge line portion may be rounded. The corner portion is a portion at which three surfaces of the multilayer body intersect, the ridge line portion is a portion at which two surfaces of the multilayer body intersect.

The first outer electrode 12a and the second outer electrode 12b are located on the surfaces of both the end portions in the length direction L. Specifically, the first outer electrode 12a is located on the first end surface 113 of the multilayer body 11, and extends to a portion of each of the first main surface 111, the second main surface 112, the first side surface 115, and the second side surface 116 from the first end surface 113, the second outer electrode 12b is located on the second end surface 114 of the multilayer body 11, and extends to a portion of each of the first main surface 111, the second main surface 112, the first side surface 115, and the second side surface 116 from the second end surface 114.

Figure 5:
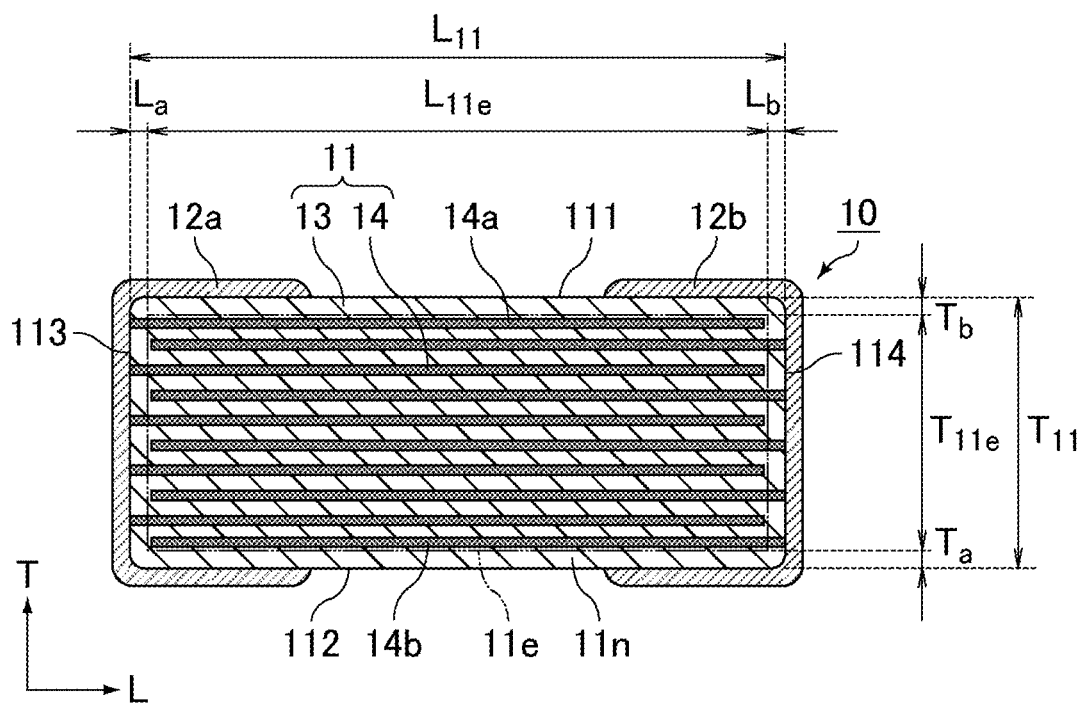
FIG. 5 is a cross-sectional view of the multilayer ceramic capacitor illustrated in FIG. 4, viewed from a direction of an arrow V-V.
Figure 6:
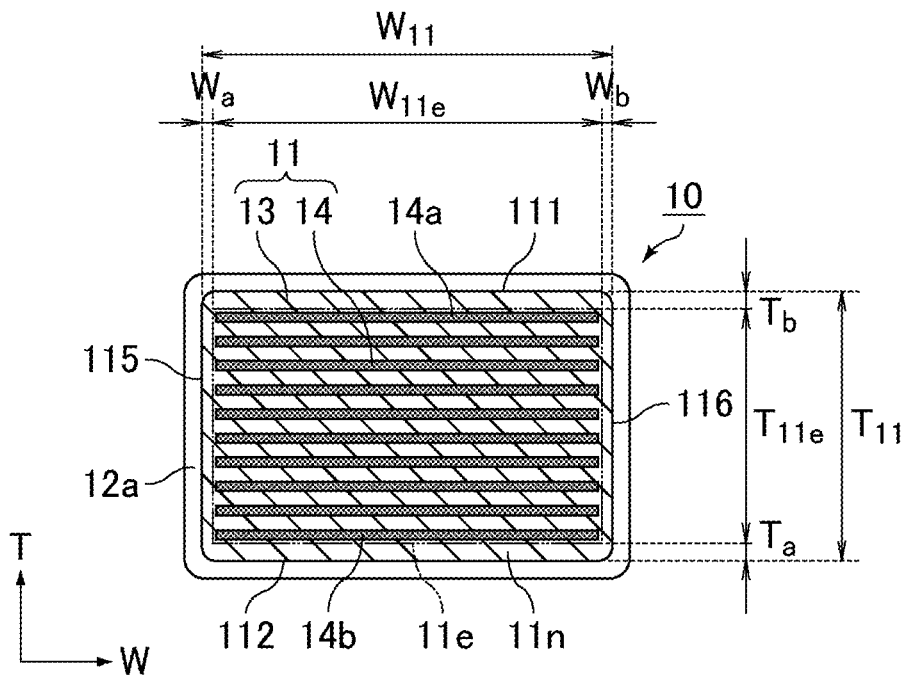
FIG. 6 is a cross-sectional view of the multilayer ceramic capacitor illustrated in FIG. 4, viewed from a direction of an arrow VI-VI.

FIG. 5 is a cross-sectional view of the multilayer ceramic capacitor illustrated in FIG. 4, viewed from a direction of an arrow V-V. FIG. 6 is a cross-sectional view of the multilayer ceramic capacitor illustrated in FIG. 4, viewed from a direction of an arrow VI-VI.

As illustrated in FIG. 5 and FIG. 6, in the multilayer body 11 of the multilayer ceramic capacitor 10, a plurality of dielectric layers 13 and a plurality of inner electrode layers 14 are laminated and alternate with one another.

In the present preferred embodiment, a lamination direction of the dielectric layers 13 and the inner electrode layers 14 is orthogonal or substantially orthogonal to the length direction L and the width direction W of the multilayer ceramic capacitor 10. In other words, the lamination direction of the dielectric layers 13 and the inner electrode layers 14 is parallel or substantially parallel to the thickness direction T of the multilayer ceramic capacitor 10.

As illustrated in FIG. 5, in the inner electrode layers opposing each other, one inner electrode layer 14 is electrically connected to the first outer electrode 12a at the first end surface 113, the other inner electrode layer 14 is electrically connected to the second outer electrode 12b at the second end surface 114. In other words, the first outer electrode 12a is electrically connected to the one inner electrode layer 14 at the first end surface 113, the second outer electrode 12b is electrically connected to the other inner electrode layer 14 at the second end surface 114.

Although, in the present preferred embodiment, all the inner electrode layers 14 are electrically connected to the first outer electrode 12a or the second outer electrode 12b, it is sufficient that at least some inner electrode layers among the plurality of inner electrode layers are electrically connected to the first outer electrode or the second outer electrode according to other preferred embodiments of the present invention. In other words, the plurality of inner electrode layers may include an inner electrode layer which is not electrically connected to the first outer electrode and the second outer electrode.

FIG. 5 and FIG. 6 illustrate a length $L_{11}$ of the multilayer body 11 in the length direction L, a width $W_{11}$ of the multilayer body 11 in the width direction W, and a thickness $T_{11}$ of the multilayer body 11 in the thickness direction T of the multilayer ceramic capacitor 10. FIG. 1 to FIG. 3 also illustrate $L_{11}$, $W_{11}$, and $T_{11}$. Note that, the maximum length of the multilayer body 11 in the length direction L, the maximum width of the multilayer body 11 in the width direction W, and the maximum thickness of the multilayer body 11 in the thickness direction T of the multilayer ceramic capacitor 10 are defined as $L_{11}$, $W_{11}$ and $T_{11}$, respectively.

As illustrated in FIG. 5 and FIG. 6, the multilayer body 11 includes an effective region 11e in which the inner electrode layers 14 each connected to the first outer electrode 12a or the second outer electrode 12b are laminated with the dielectric layer 13 located therebetween, and a non-effective region 11n surrounding the effective region 11e.

Specifically, the effective region 11e of the multilayer body 11 is a region where a portion defining and functioning as a capacitor which includes the inner electrode layer 14 electrically connected to the first outer electrode 12a, the inner electrode layer 14 electrically connected to the second outer electrode 12b, and the dielectric layer 13 sandwiched by these two inner electrode layers 14 is laminated.

In FIG. 5 and FIG. 6, the effective region 11e of the multilayer body 11 is a region where all the inner electrode layers 14 are laminated each other when viewed in the thickness direction T, in a region from a first inner electrode layer 14a located closest to the first main surface 111 side among the plurality of inner electrode layers 14 to a second inner electrode layer 14b located closest to the second main surface 112 side among the plurality of inner electrode layers 14.

FIG. 5 and FIG. 6 illustrate a length $L_{11e}$ of the effective region 11e of the multilayer body 11 in the length direction L, a width $W_{11e}$ of the effective region 11e of the multilayer body 11 in the width direction W, and a thickness $T_{11e}$ of the effective region 11e of the multilayer body 11 in the thickness direction T of the multilayer ceramic capacitor 10. FIG. 1 to FIG. 3 also illustrate $L_{11e}$, $W_{11e}$, and $T_{11e}$.

The non-effective region 11n of the multilayer body 11 is a portion located in an outer side portion of the effective region 11e in the multilayer body 11, and a region which does not define and does not function as a capacitor.

FIG. 5 and FIG. 6 illustrate a length $L_a$ of the non-effective region 11n on the first end surface 113 side and a length $L_b$ of the non-effective region 11n on the second end surface 114 side in the length direction L, a width $W_a$ of the non-effective region 11n on the first side surface 115 side and a width $W_b$ of the non-effective region 11n on the second side surface 116 side in the width direction W, and a thickness $T_b$ of the non-effective region 11n on the first main surface 111 side and a thickness $T_a$ of the non-effective region 11n on the second main surface 112 side in the thickness direction T of the multilayer ceramic capacitor 10. FIG. 1 and FIG. 3 also illustrate $L_a$, $L_b$, $W_a$, $W_b$, $T_b$, and $T_a$.

As a material included in each of the plurality of dielectric layers 13, dielectric ceramics including $BaTiO_3$, $CaTiO_3$, $SrTiO_3$, $CaZrO_3$, or the like as a primary component are able to be included. Additionally, dielectric ceramics in which an Mn compound, an Mg compound, an Si compound, a Co compound, an Ni compound, a rare earth compound, or the like is added to these primary components as a secondary component may be included.

As a material included in each of the plurality of inner electrode layers 14, a metal, for example, Ni, Cu, Ag, Pd, Au, or the like, or an alloy including at least one type of these metals, for example, an alloy of Ag and Pd or the like are able to be included.

The first outer electrode 12a and the second outer electrode 12b each preferably include a base layer provided to cover both the end portions of the multilayer body 11, and a plating layer provided to cover the base layer. As a material included in the base layer, a metal, for example, Ni, Cu, Ag, Pd, Au or the like, or an alloy including at least one type of these metals, for example, an alloy of Ag and Pd or the like are able to be included.

As a method that forms the base layer, for example, a method in which conductive paste applied to both the end portions of the multilayer body 11 after firing is baked, a method in which conductive paste applied to both the end portions of the multilayer body 11 before firing is fired at the same or substantially the same time as the inner electrode layer 14, or the like are able to be applied. Additionally, a method in which both the end portions of the multilayer body 11 are plated, or a method in which conductive resin including thermosetting resin applied to both the end portions of the multilayer body 11 is cured may be applied.

As a material included in the plating layer, a metal, for example, Sn, Ni, Cu, Ag, Pd, Au, or the like, or an alloy including at least one type of these metals, for example, an alloy of Ag and Pd or the like is able to be included.

The plating layer may include a plurality of layers. In this case, the plating layer preferably includes a two-layer structure in which an Sn plating layer is formed on an Ni plating layer. The Ni plating layer provides a solder barrier layer. The Sn plating layer provides good solder wettability.

Figure 7:
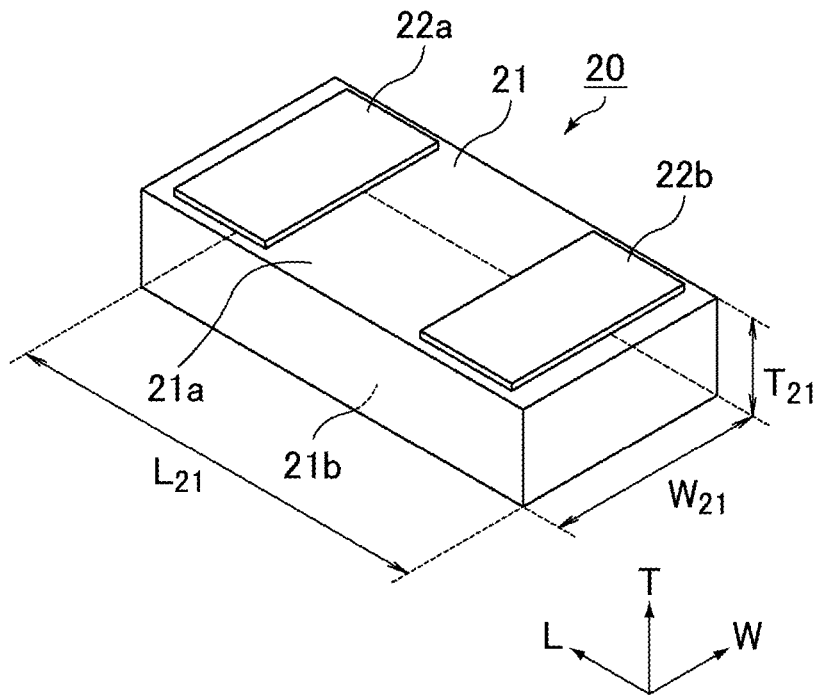
FIG. 7 is a perspective view of an interposer of the electronic component illustrated in FIG. 1, viewed from one main surface side.

FIG. 7 is a perspective view of the interposer of the electronic component illustrated in FIG. 1, viewed from the one main surface side.

As illustrated in FIG. 7, the interposer 20 includes the substrate main body 21 with an electric insulation property. In the present preferred embodiment, the substrate main body 21 includes a rectangular or a substantially rectangular outer shape when viewed in a plan view. However, the substrate main body 21 is not limited to the rectangular or the substantially rectangular outer shape, for example, and may include an elliptical or substantially elliptical outer shape or the like. The substrate main body 21 may include chamfered corner portions and ridge line portions.

The substrate main body 21 includes the one main surface 21a (see FIG. 1) on a side to which the multilayer ceramic capacitor 10 is mounted, the other main surface 21b on an opposite side to the one main surface 21a, and a circumferential surface connecting the one main surface 21a and the other main surface 21b.

FIG. 7 illustrates a length $L_{21}$ of the substrate main body 21 in the length direction L, a width $W_{21}$ of the substrate main body 21 in the width direction W, and a thickness $T_{21}$ of the substrate main body 21 in the thickness direction T of the multilayer ceramic capacitor 10. As described above, the thickness direction T is a direction orthogonal or substantially orthogonal to the one main surface 21a of the substrate main body 21. FIG. 1 to FIG. 3 also illustrate $L_{21}$, $W_{21}$, and $T_{21}$. Note that, the maximum length of the substrate main body 21 in the length direction L, the maximum width of the substrate main body 21 in the width direction W, and the maximum thickness of the substrate main body 21 in the thickness direction T of the multilayer ceramic capacitor 10 are defined as $L_{21}$, $W_{21}$, and $T_{21}$, respectively.

As a material of the substrate main body 21, a resin material, for example, epoxy resin, a ceramic material, for example, alumina, or the like is able to be included. Additionally, a filler or a woven fabric including an inorganic material or an organic material may be added to the material of the substrate main body 21.

As illustrated in FIG. 7, the interposer 20 includes a first land electrode 22a and a second land electrode 22b provided on the one main surface 21a. Specifically, the first land electrode 22a and the second land electrode 22b are provided with a gap in the length direction L. The first land electrode 22a and the second land electrode 22b each include a rectangular or a substantially rectangular outer shape when viewed in a plan view, and is distanced from the circumferential surface of the substrate main body 21. The first land electrode 22a and the second land electrode 22b each include a conductive material, for example, Cu or the like.

The interposer 20 may be provided with a connection electrode electrically connected to a land electrode of a circuit substrate, which is not illustrated, on the other main surface 21b. In this case, the interposer 20 is preferably provided with a through-electrode electrically connecting the first land electrode 22a or the second land electrode 22b on the one main surface 21a and the connection electrode. Additionally, the interposer 20 may be provided with a through-electrode electrically connected to the first land electrode 22a or the second land electrode 22b on the one main surface 21a, and may not be provided with the connection electrode. Note that, in a case where the connection electrode is not provided, the first outer electrode 12a or the second outer electrode 12b of the multilayer ceramic capacitor 10, the first land electrode 22a or the second land electrode 22b of the interposer 20, or the through-electrode of the interposer 20 may be electrically connected to the land electrode of circuit substrate.

As illustrated in FIG. 1 to FIG. 3, in the electronic component 100, the first outer electrode 12a and the second outer electrode 12b of the multilayer ceramic capacitor 10 and the first land electrode 22a and the second land electrode 22b of the interposer 20 are electrically connected, respectively, by solder, a conductive adhesive, or the like, which is not illustrated.

In an electronic component according to a preferred embodiment of the present invention, the width $W_{11e}$ of the effective region of the multilayer body is larger than the width $W_{21}$ of the substrate main body. By increasing the width $W_{11e}$ of the effective region, a capacitance of the multilayer ceramic capacitor is able to be increased.

In an electronic component according to a preferred embodiment of the present invention, when the width of the effective region is represented by $W_{11e}$, and the width of the substrate main body is represented by $W_{21}$, a value of $W_{11e}/W_{21}$ is preferably not more than about 1.19, for example.

In an electronic component according to a preferred embodiment of the present invention, when the width of the multilayer body is represented by $W_{11}$, the thickness of the multilayer body is represented by $T_{11}$, and the thickness of the substrate main body is represented by $T_{21}$, a value of $W_{11}/(T_{11}+T_{21})$ is not less than about 0.90, and not more than about 1.10, for example. The value of $W_{11}/(T_{11}+T_{21})$ is preferably not less than about 0.95, and preferably not more than about 1.05, for example. Making the value of $W_{11}/(T_{11}+T_{21})$ close to about 1, for example, significantly reduces or prevents acoustic noise. Note that, although there may be a gap between the multilayer body and the substrate main body, since the gap is smaller than the value of $(T_{11}+T_{21})$, the gap only applies a small influence on the acoustic noise and is not taken into account.

In an electronic component according to a preferred embodiment of the present invention, the thickness $T_{21}$ of the substrate main body is preferably not less than about 30 μm, for example. Furthermore, the thickness $T_{21}$ of the substrate main body is preferably not more than about 80 μm, for example.

In an electronic component according to a preferred embodiment of the present invention, both the width $W_a$ of the non-effective region on the first side surface side and the width $W_b$ of the non-effective region on the second side surface side are preferably not less than about 10 μm, for example. Furthermore, both the width $W_a$ of the non-effective region on first side surface side and the width $W_b$ of the non-effective region on the second side surface side are preferably not more than about 20 μm, for example.

In an electronic component according to a preferred embodiment of the present invention, when the thickness of the substrate main body is represented by $T_{21}$, the width of the non-effective region on the first side surface side is represented by $W_a$, and the width of the non-effective region on the second side surface side is represented by $W_b$, both a value of $W_a/T_{21}$ and a value of $W_b/T_{21}$ are preferably not less than about 0.13, for example. Furthermore, both the value of $W_a/T_{21}$ and the value of $W_b/T_{21}$ are preferably not more than about 0.67, for example.

In an electronic component according to a preferred embodiment of the present invention, when the thickness of the substrate main body is represented by $T_{21}$, the thickness of the non-effective region on the second main surface side is represented by $T_a$, a value of $T_a/T_{21}$ is preferably not less than about 0.15, for example. Furthermore, the value of $T_a/T_{21}$ is preferably not more than about 0.50, for example.

In an electronic component according to a preferred embodiment of the present invention, when the thickness of the substrate main body is represented by $T_{21}$, the thickness of the non-effective region on the first main surface side is represented by $T_b$, a value of $T_b/T_{21}$ is preferably not less than about 0.15, for example. Furthermore, the value of $T_b/T_{21}$ is preferably not more than about 0.50, for example.

When measuring various types of dimensions, a polished cross-section of the electronic component is monitored under an optical microscope, for example, at a magnification of about 10-fold, a dimension on the straight line passing through the center of the polished cross-section is measured. In a case where it is difficult to clearly measure the dimension under the optical microscope, a scanning electron microscope may be used to monitor the polished cross-section instead of the optical microscope.

For example, when the thickness $T_a$ of the non-effective region 11n being a portion located between the second main surface 112 and the effective region 11e in the multilayer body 11 is measured, a straight line extending in the lamination direction of the multilayer body 11 and passing through the center of the multilayer body 11 is drawn in an enlarged image that is a cross-section of the multilayer ceramic capacitor 10 being monitored under the optical microscope, and the thickness $T_a$ of the non-effective region 11n on the straight line is measured.

The effective region 11e of the multilayer body 11 is able to be confirmed by monitoring a polished cross-section under the optical microscope similar to the above-described method. Alternatively, the effective region 11e of the multilayer body 11 is able to be confirmed by monitoring a transmission image captured by irradiating the electronic component 100 with X-rays from the first main surface 111 side or the second main surface 112 side. The width of the effective region 11e of the multilayer body 11 is defined as a width from one end of the inner electrode layer 14 located in the outermost side portion on one side of the multilayer body 11 in the width direction to the other end of the inner electrode layer 14 located in the outermost side portion on the other side of the multilayer body 11 in the width direction.

Hereinafter, a method of manufacturing an electronic component according to a preferred embodiment of the present invention will be described.

The method of manufacturing the electronic component includes a process that prepares the multilayer capacitor, and a process that mounts the multilayer capacitor on one main surface side of the substrate main body of the interposer.

Hereinafter, as a non-limiting example of a preferred embodiment of a method of manufacturing the electronic component according to the present invention, a method of manufacturing the electronic component 100 illustrated in FIG. 1 will be described.

An organic binder, plasticizer, an organic solvent, and the like are added to a ceramic material to be a raw material of the dielectric layer and mixed to manufacture ceramic slurry. This ceramic slurry is applied on a resin film into a substantially sheet shape to form a plurality of rectangular or substantially rectangular ceramic green sheets. The ceramic green sheet is formed, for example, by a die coater, a gravure coater, a micro-gravure coater, or the like.

Figure 8A:
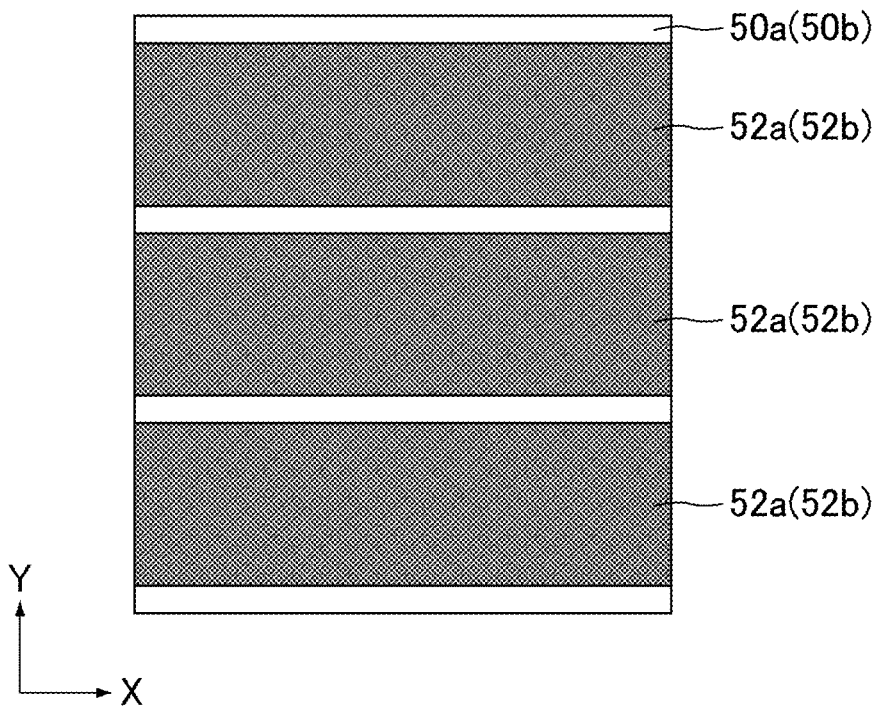
FIG. 8A is a plan view schematically illustrating a state where a conductive film is provided on a ceramic green sheet.
Figure 8B:
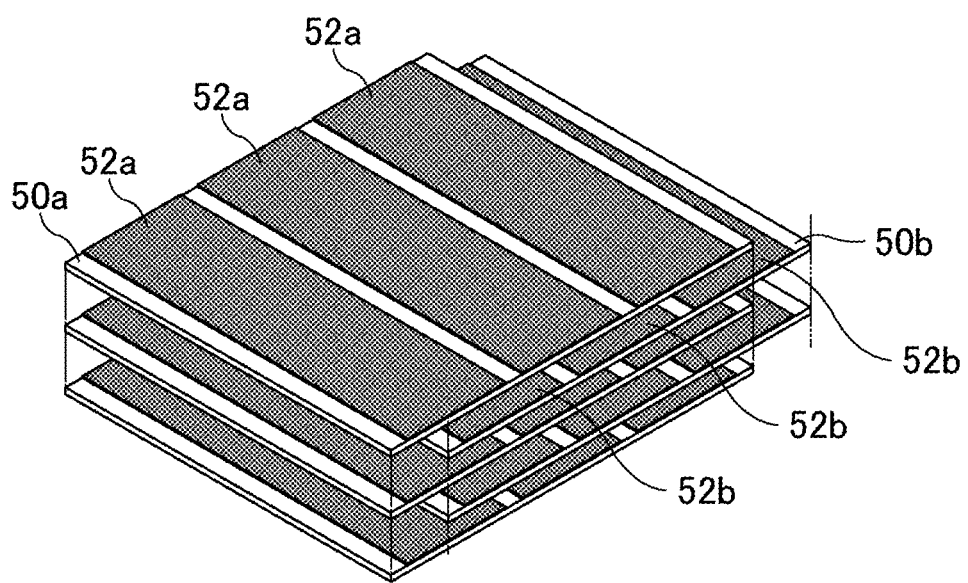
FIG. 8B is a perspective view schematically illustrating a state where the ceramic green sheets on which the conductive films are each provided are stacked.

FIG. 8A is a plan view schematically illustrating a state where a conductive film is provided on the ceramic green sheet, FIG. 8B is a perspective view schematically illustrating a state where the ceramic green sheets on which the conductive films are each formed are stacked.

As illustrated in FIG. 8A, on surfaces of ceramic green sheets 50a and 50b, conductive paste of the inner electrode layer containing Ni or the like as its primary component is applied in a substantially stripe shape in an X direction through screen printing and dried to form conductive films 52a and 52b to be the inner electrode layers 14. As the printing method, various types of methods, for example, screen printing, ink jet printing, gravure printing, or the like are applied.

Next, as illustrated in FIG. 8B, the ceramic green sheets 50a and 50b on which the conductive films 52a and 52b are printed, respectively, are shifted in a direction (a width direction of the conductive films 52a and 52b: Y direction) orthogonal or substantially orthogonal to the direction (X direction) in which the conductive films 52a and 52b are printed, and stacked. Furthermore, on an upper surface and a lower surface of the stacked ceramic green sheets 50a and 50b, the predetermined number of ceramic green sheets on which the conductive film is not provided are preferably stacked to provide a mother multilayer body.

Subsequently, the mother multilayer body is pressed. As a method to press the mother multilayer body, a method, for example, rigid body pressing, isostatic pressing, or the like is applied.

Figure 9:
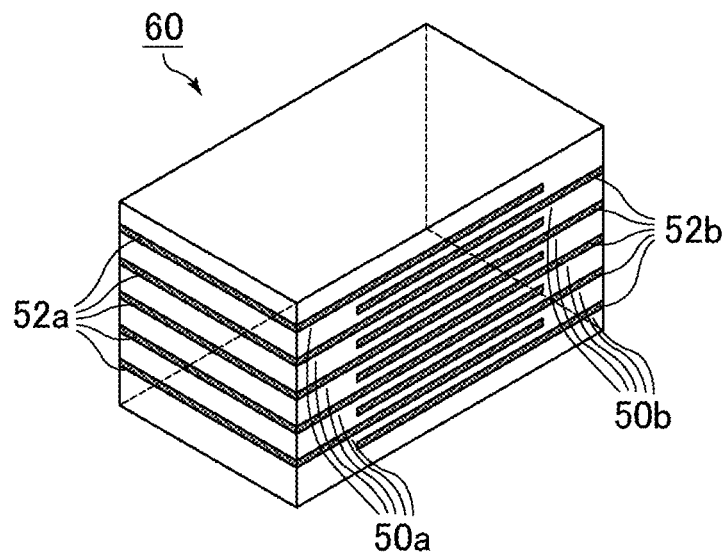
FIG. 9 is a schematic perspective view illustrating an example of an outer appearance of a multilayer body chip.

FIG. 9 is a schematic perspective view illustrating an example of an outer appearance of a multilayer body chip.

The pressed mother multilayer body is cut into a substantially chip shape, and a multilayer body chip 60 as illustrated in FIG. 9 is provided. As a method of cutting the mother multilayer body, various types of methods, for example, press-cutting, cutting with a dicing machine, laser cutting, or the like are applied.

Through the above-described processes, the multilayer body chip 60 includes one end surface on which only the conductive films 52a of the ceramic green sheets 50a are exposed, and the other end surface on which only the conductive films 52b of the ceramic green sheets 50b are exposed. Additionally, the multilayer body chip 60 includes both side surfaces on which the conductive films 52a of the ceramic green sheets 50a and the conductive films 52b of the ceramic green sheets 50b are exposed.

Thereafter, on each of the side surfaces of the multilayer body chip 60 illustrated in FIG. 9, a raw ceramic protective layer is formed, and the multilayer body chip before firing is provided. The raw ceramic protective layer is formed by bonding a ceramic green sheet of the ceramic protective layer, or applying ceramic slurry of the ceramic protective layer.

The multilayer body chip on which the raw ceramic protective layer is formed is preferably dried and fired thereafter to provide the multilayer body 11.

Conductive paste is applied to the first end surface 113 and the second end surface 114 of the multilayer body 11 and then baked, and a plating process is preferably performed thereon, to form the first outer electrode 12a and the second outer electrode 12b.

By performing the example process described above, the multilayer ceramic capacitor 10 is manufactured.

By bonding the first outer electrode 12a and the second outer electrode 12b of the multilayer ceramic capacitor 10 to the first land electrode 22a and the second land electrode 22b on the substrate main body 21 of the interposer 20, respectively, by solder or the like, it is possible to mount the multilayer ceramic capacitor 10 on the one main surface 21a side of the substrate main body 21.

As described above, the electronic component 100 illustrated in FIG. 1 is able to be manufactured.

Hereinafter, a working example in which an electronic component according to a preferred embodiment of the present invention is more specifically disclosed will be described. Note that, the preferred embodiments of the present invention are not intended to be limited to only this working example.

By preparing the multilayer ceramic capacitor and the interposer which include respective dimensions shown in Table 1, and mounting the multilayer ceramic capacitor on the one main surface side of the substrate main body of the interposer, the electronic component was manufactured. In the first working example, the width $W_{11e}$ of the effective region of the multilayer body is larger than the width $W_{21}$ of the substrate main body. Additionally, when the width of the multilayer body is represented by $W_{11}$, the thickness of the multilayer body is represented by $T_{11}$, and the thickness of the substrate main body is represented by $T_{21}$, a value of $W_{11}/(T_{11}+T_{21})$ is about 1.05.

By preparing the multilayer ceramic capacitor and the interposer which include respective dimensions shown in Table 1, and mounting the multilayer ceramic capacitor on the one main surface side of the substrate main body of the interposer, the electronic component was manufactured. In the first comparative example, the width $W_{11e}$ of the effective region of the multilayer body is larger than the width $W_{21}$ of the substrate main body. Additionally, when the width of the multilayer body is represented by $W_{11}$, the thickness of the multilayer body is represented by $T_{11}$, and the thickness of the substrate main body is represented by $T_{21}$, a value of $W_{11}/(T_{11}+T_{21})$ is about 0.84.

ing body 100β is collected by the sound collection microphone 910 and a sound collector 920, the collected sound is analyzed by FFT (Fast Fourier Transform) analyzer 930 (CF-5220 manufactured by ONO SOKKI CO., LTD).

Figure 11:
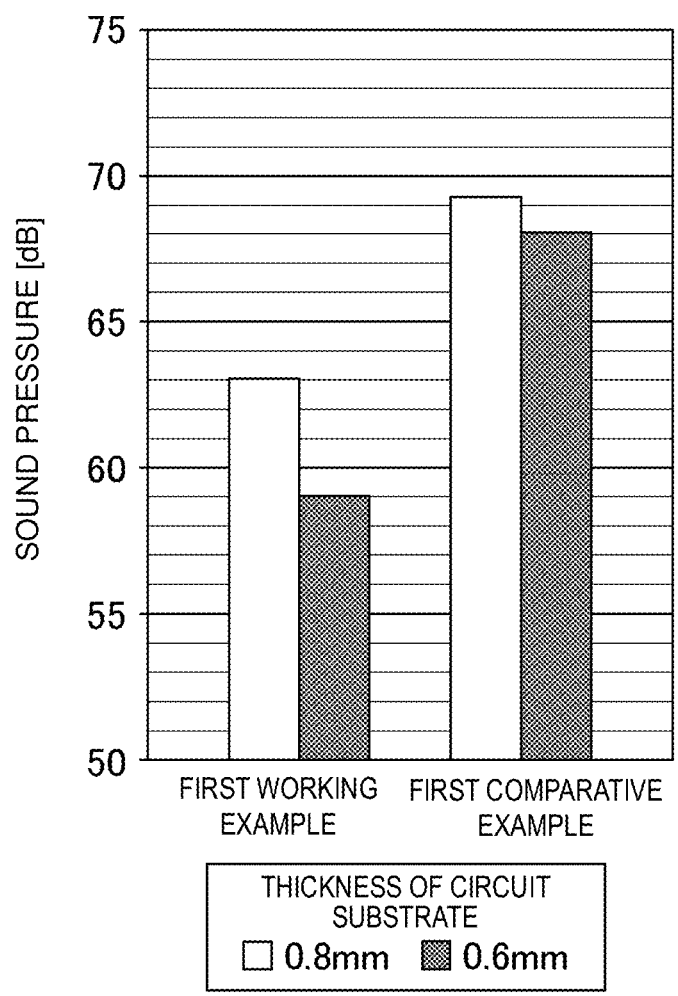
FIG. 11 is a graph illustrating a measurement result of the sound pressure of the noise in a first working example and a first comparative example.

FIG. 11 is a graph illustrating a measurement result of the sound pressure of the noise in the first working example and the first comparative example. FIG. 11 illustrates a result in a case where the thickness of the circuit substrate is about 0.8 mm and about 0.6 mm.

From FIG. 11, when the thickness of the circuit substrate is about 0.8 mm, it is possible to confirm that the sound pressure of the noise generated from the electronic component mounting body in the first working example by the multilayer ceramic capacitor in which the value of $W_{11}/(T_{11}+T_{21})$ is about 1.05 is smaller than that in the first comparative example by the multilayer ceramic capacitor in which the value of $W_{11}/(T_{11}+T_{21})$ is about 0.84. When the thickness of the circuit substrate is about 0.6 mm as well, it is possible to confirm that the sound pressure of the noise generated from the electronic component mounting body in the first working example is smaller than that in first comparative example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a multilayer capacitor; and

TABLE 1

| | MULTILAYER CAPACITOR (MULTILAYER BODY) | | | | | | | | INTERPOSER (SUBSTRATE MAIN BODY) | | ELECTRONIC COMPONENT | | | | | |
|---|---|---|---|---|---|---|---|---|---|---|---|---|---|---|---|---|
| | $L_{11}$ [μm] | $W_{11}$ [μm] | $T_{11}$ [μm] | $T_a$ [μm] | $T_b$ [μm] | $W_a$ [μm] | $W_b$ [μm] | $W_{11e}$ [μm] | $W_{11}/T_{11}$ | $W_{21}$ [μm] | $T_{21}$ [μm] | $W_{11e}/W_{21}$ | $T_{11}+T_{21}$ [μm] | $W_{11}/(T_{11}+T_{21})$ | $T_a/T_{21}$ | $W_a/T_{21}$ | $W_b/T_{21}$ |
| first working example | 1120 | 630 | 520 | 32 | 32 | 18 | 18 | 594 | 1.21 | 560 | 80 | 1.061 | 600 | 1.05 | 0.40 | 0.225 | 0.225 |
| first comparative example | 1120 | 630 | 630 | 32 | 32 | 18 | 18 | 594 | 1.00 | 560 | 120 | 1.061 | 750 | 0.84 | 0.27 | 0.15 | 0.15 |

Figure 10:
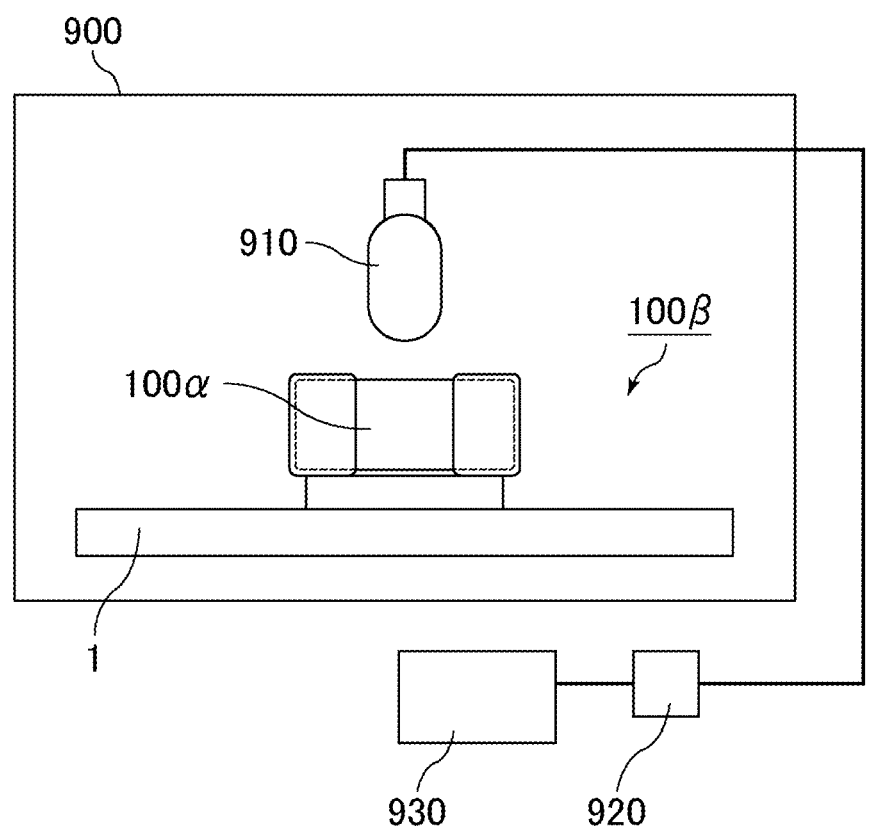
FIG. 10 is a schematic diagram illustrating a method that measures sound pressure of a noise generated from a circuit substrate on which the electronic component is mounted.

FIG. 10 is a schematic diagram illustrating a method that measures sound pressure of a noise generated from a circuit substrate on which the electronic component is mounted.

As illustrated in FIG. 10, when measuring the sound pressure of the noise, in a state where an electronic component mounting body 100β in which an electronic component 100α is mounted on a circuit substrate 1 is installed in an anechoic box 900, a DC voltage of about 3.0 V and an AC voltage of about 1.0 Vpp in a frequency band of about 1.5 kHz to about 20 kHz are applied to the multilayer ceramic capacitor of the electronic component 100α, a total sound pressure level of the noise occurring at this time was measured.

Note that, the measurement of the total sound pressure level of the noise is performed, for example, a sound collection microphone 910 is located on a position about 3 mm above the multilayer ceramic capacitor of the electronic component 100α to oppose each other in the anechoic box 900, sound generated from the electronic component mountan interposer including a substrate main body with an electric insulation property; wherein the multilayer capacitor is mounted on one main surface side of the substrate main body;

the multilayer capacitor includes a multilayer body in which a plurality of dielectric layers and a plurality of inner electrode layers are laminated, a first outer electrode, and a second outer electrode;

the multilayer body includes a first main surface opposing in a thickness direction orthogonal or substantially orthogonal to the one main surface of the substrate main body, a second main surface opposing in the thickness direction orthogonal or substantially orthogonal to the one main surface of the substrate main body and opposing the one main surface of the substrate main body, a first end surface and a second end surface opposing each other in a length direction orthogonal or substantially orthogonal to the thickness direction, and a first side surface and a second side surface opposing each other in a width direction orthogonal or substantially orthogonal to the thickness direction and the length direction;

the first outer electrode is located on the first end surface of the multilayer body, and electrically connected to at least a first portion of the plurality of inner electrode layers;

the second outer electrode is located on the second end surface of the multilayer body, and electrically connected to at least a second portion of among the plurality of inner electrode layers;

the multilayer body includes an effective region in which the inner electrode layers each connected to the first outer electrode and the second outer electrode are laminated with the dielectric layer located therebetween and a non-effective region surrounding the effective region;

a width $W_{11e}$ of the effective region is larger than a width $W_{21}$ of the substrate main body;

when a width of the multilayer body is represented by $W_{11}$, a thickness of the multilayer body is represented by $T_{11}$, and a thickness of the substrate main body is represented by $T_{21}$, a value of $W_{11}/(T_{11}+T_{21})$ is not less than about 0.90 and not more than about 1.10; and when a thickness of the non-effective region on the second main surface side is represented by $T_d$, a value of $T_d/T_{21}$ is not less than about 0.15 and not more than about 0.50.

2. The electronic component according to claim 1, wherein the thickness $T_{21}$ of the substrate main body is not more than about 80 μm.

3. The electronic component according to claim 1, wherein both a width $W_a$ of the non-effective region on the first side surface side and a width $W_b$ of the non-effective region on the second side surface side are not more than about 20 μm.

4. The electronic component according to claim 1, wherein when the width of the non-effective region on the first side surface side is represented by $W_a$, the width of the non-effective region on the second side surface side is represented by $W_b$, both a value of $W_a/T_{21}$ and a value of $W_b/T_{21}$ are not less than about 0.13 and not more than about 0.67.

5. The electronic component according to claim 1, wherein the multilayer body includes a rectangular parallelepiped or a substantially rectangular parallelepiped outer shape.

6. The electronic component according to claim 1, wherein at least one of a corner portion and a ridge line portion of the multilayer body is rounded, the corner portion being defined by an intersection of three surfaces of the multilayer body and the ridge line portion being defined by an intersection of two surfaces of the multilayer body.

7. The electronic component according to claim 1, wherein
the first outer electrode extends from the first end surface to a first portion of each of the first main surface, the second main surface, the first side surface, and the second side surface; and
the second outer electrode extends from the second end surface to a second portion of each of the first main surface, the second main surface, the first side surface, and the second side surface.

8. The electronic component according to claim 1, wherein the plurality of inner electrode layers includes at least one inner electrode layer that is not electrically connected to either of the first outer electrode and the second outer electrode.

9. The electronic component according to claim 1, wherein the effective region is a region of the multilayer body where the first portion of the plurality of inner electrode layers and the second portion of the plurality of inner electrode layers define and function as a capacitor.

10. The electronic component according to claim 1, wherein the non-effective region is a region of the multilayer body where the first portion of the plurality of inner electrode layers and the second portion of the plurality of inner electrode layers do not define and function as a capacitor.

11. The electronic component according to claim 1, wherein a material of each of the plurality of dielectric layers is a dielectric ceramic.

12. The electronic component according to claim 11, wherein the material of each of the plurality of dielectric layers includes $BaTiO_3$, $CaTiO_3$, $SrTiO_3$, or $CaZrO_3$ as a primary component and an Mn compound, an Mg compound, an Si compound, a Co compound, an Ni compound, or a rare earth compound as a secondary component.

13. The electronic component according to claim 1, wherein a material of each of the plurality of inner electrode layers includes Ni, Cu, Ag, Pd, Au, or an alloy including at least one of Ni, Cu, Ag, Pd, and Au.

14. The electronic component according to claim 1, wherein
the first outer electrode includes a first base layer provided on the first end surface and a first plating layer that covers the first base layer; and
the second outer electrode includes a second base layer provided on the second end surface and a second plating layer that covers the second base layer.

15. The electronic component according to claim 14, wherein a material of each of the first base layer and the second base layer includes Ni, Cu, Ag, Pd, Au, or an alloy including at least one of Ni, Cu, Ag, Pd, and Au.

16. The electronic component according to claim 14, wherein a material of each of the first plating layer and the second plating layer includes Sn, Ni, Cu, Ag, Pd, Au, or an alloy including at least one of Ni, Cu, Ag, Pd, and Au.

17. The electronic component according to claim 14, wherein each of the first plating layer and the second plating layer includes a two-layer structure of an Sn plating layer and an Ni plating layer.

18. The electronic component according to claim 1, wherein
the interposer includes a first land electrode and a second land electrode that are both provided on a first main surface of the interposer;
the first land electrode is electrically connected to the first outer electrode of the multilayer capacitor; and
the second land electrode is electrically connected to the second outer electrode of the multilayer capacitor.

19. The electronic component according to claim 18, wherein the interposer includes a through electrode that electrically connects one of the first land electrode and the second land electrode to a connection electrode located on a second main surface of the interposer.

20. An electronic comprising:
a multilayer capacitor; and
an interposer including a substrate main body with an electric insulation property; wherein
the multilayer capacitor is mounted on one main surface side of the substrate main body;

the multilayer capacitor includes a multilayer body in which a plurality of dielectric layers and a plurality of inner electrode layers are laminated, a first outer electrode, and a second outer electrode;

the multilayer body includes a first main surface opposing in a thickness direction orthogonal or substantially orthogonal to the one main surface of the substrate main body, a second main surface opposing in the thickness direction orthogonal or substantially orthogonal to the one main surface of the substrate main body and opposing the one main surface of the substrate main body, a first end surface and a second end surface opposing each other in a length direction orthogonal or substantially orthogonal to the thickness direction, and a first side surface and a second side surface opposing each other in a width direction orthogonal or substantially orthogonal to the thickness direction and the length direction;

the first outer electrode is located on the first end surface of the multilayer body, and electrically connected to at least a first portion of the plurality of inner electrode layers;

the second outer electrode is located on the second end surface of the multilayer body, and electrically connected to at least a second portion of among the plurality of inner electrode layers;

the multilayer body includes an effective region in which the inner electrode layers each connected to the first outer electrode and the second outer electrode are laminated with the dielectric layer located therebetween and a non-effective region surrounding the effective region;

a width $W_{11e}$ of the effective region is larger than a width $W_{21}$ of the substrate main body;

when a width of the multilayer body is represented by $W_{11}$, a thickness of the multilayer body is represented by $T_{11}$, and a thickness of the substrate main body is represented by $T_{21}$, a value of $W_{11}/(T_{11}+T_{21})$ is not less than about 0.90 and not more than about 1.10; and both a width $W_a$ of the non-effective region on the first side surface side and a width $W_b$ of the non-effective region on the second side surface side are not more than about 20 μm.

* * * * *